United States Patent [19]

Pattanayak et al.

[11] Patent Number: 4,980,740
[45] Date of Patent: Dec. 25, 1990

[54] MOS-PILOT STRUCTURE FOR AN INSULATED GATE TRANSISTOR

[75] Inventors: Deva N. Pattanayak, Schenectady, N.Y.; Bantval J. Baliga, Raleigh, N.C.

[73] Assignee: General Electric Company, Schenectady, N.Y.

[21] Appl. No.: 329,034

[22] Filed: Mar. 27, 1989

[51] Int. Cl.$^5$ ............................................. H01L 29/74
[52] U.S. Cl. ........................................ 357/38; 357/39; 357/23.4; 357/41
[58] Field of Search ...................... 357/38, 39, 23.4, 41

[56] References Cited

U.S. PATENT DOCUMENTS

| | | | |
|---|---|---|---|
| 4,705,759 | 11/1987 | Lidow et al. | 357/23.4 |
| 4,811,072 | 3/1989 | Risberg | 357/38 |
| 4,816,892 | 3/1989 | Temple | 357/23.4 |
| 4,823,176 | 4/1989 | Baliga et al. | 357/23.4 |
| 4,857,977 | 8/1989 | Temple | 357/23.4 |
| 4,908,682 | 3/1990 | Takahashi | 357/23.4 |

FOREIGN PATENT DOCUMENTS

| | | | |
|---|---|---|---|
| 0267447 | 5/1988 | European Pat. Off. | 357/23.4 |
| 63-209169 | 8/1988 | Japan | 357/38 |
| 63-209173 | 8/1988 | Japan | 357/38 |

Primary Examiner—Rolf Hille
Assistant Examiner—Steven Loke
Attorney, Agent, or Firm—Marvin Snyder; James C. Davis, Jr.

[57] ABSTRACT

A MOS-pilot structure for an IGT device consisting of a multiplicity of IGT cells interconnected in a lattice network includes a plurality of pilot emitter electrodes each in electrical contact with only at least one pilot emitter region of a first plurality of the multiplicity of IGT cells and electrically isolated from a common cathode electrode of the multiplicity of IGT cells. The plurality of pilot emitter electrodes are each electrically connected to a contact metal strip deposited on the substrate surface and spaced therefrom by a layer of insulation. The contact metal strip is connected to ground potential through a sense resistor for producing a sense voltage responsive only to the channel currents flowing through the at least one pilot emitter regions; therefore, a MOS pilot structure that utilizes only the MOS channel current to produce the sense voltage to cause turn-off of the IGT device at a large total current is disclosed. The MOS-pilot structure does not suffer from the avalanche breakdown problems during turn-off, that are associated with other prior art IGT pilot structures.

18 Claims, 10 Drawing Sheets

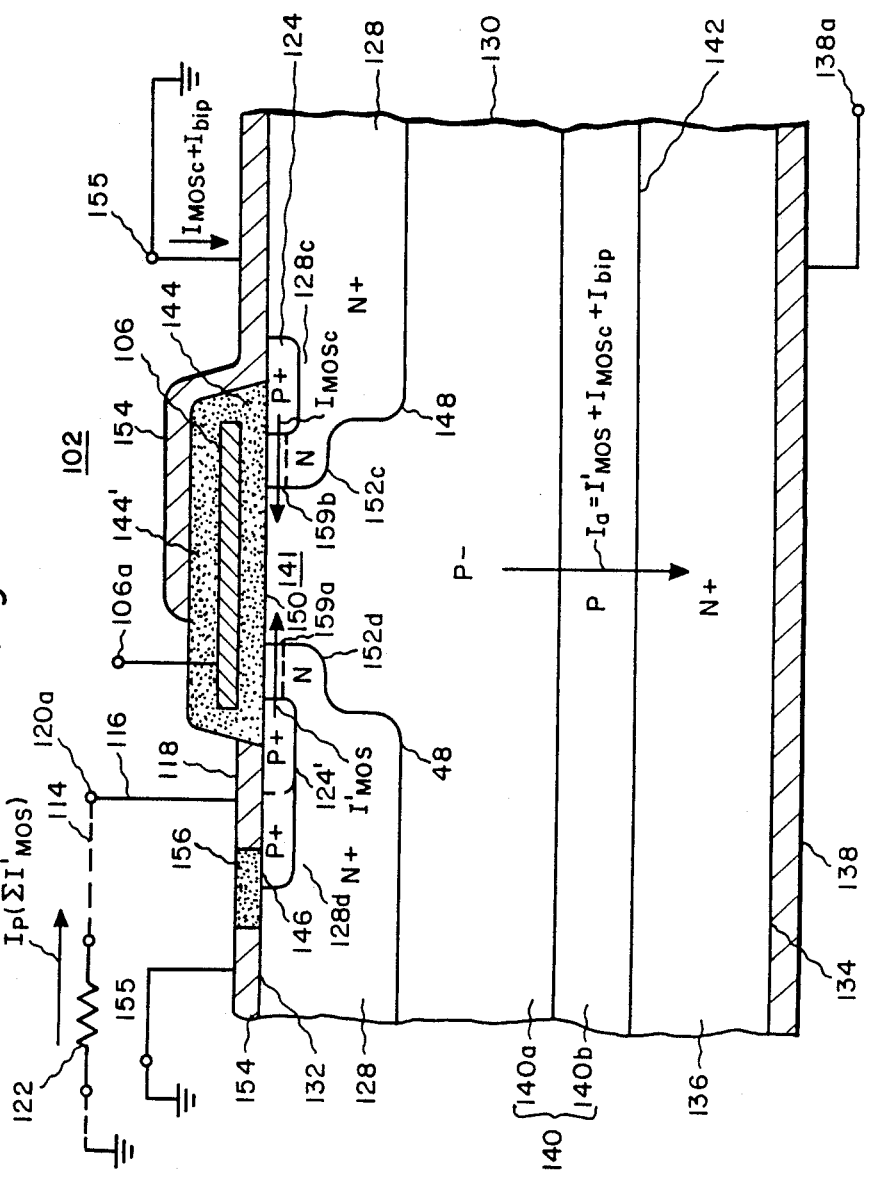

MOS-PILOT STRUCTURE FOR AN INSULATED GATE TRANSISTOR

BACKGROUND OF THE INVENTION

The present invention relates to metal-oxide-semiconductor (MOS) devices and, more particularly, to a novel MOS-pilot structure for providing a pilot current which is an accurate representation of the total current then flowing in an insulated gate transistor (IGT).

The total current flowing in an operational IGT consists of two components' the MOS channel current and the bipolar current. The MOS channel current flows in response to a voltage being applied to the gate of the IGT, and the bipolar current is the current which is conducted by the bipolar transistor formed by the lower three semiconductor layers of the IGT when a voltage is also applied to the anode of the IGT.

A known prior art IGT pilot structure that allows sensing of the bipolar current has a base region contact connected to ground through a sense resistor This bipolar pilot is undesirably subject to inaccuracies because the bipolar current may not linearly track the main IGT current due to fluctuations in the gain of the bipolar transistor and because of the recombination of the electrons and holes in the drift region of the IGT substrate due to the lifetime of the majority and minority current carriers. Additionally, during turn-off the bipolar current can develop an undesirably large potential difference across the sense resistor between the IGT's base region and ground relative to the cathode of the main IGT cell and ground which can cause avalanche breakdown of the main IGT cell.

Another IGT pilot structure allows the combined MOS channel current and the bipolar current to be sensed. This MOS-pilot structure has a common contact electrical/ connected to both the emitter region and the base region of the IGT and also through a sense resistor to ground. This pilot structure will more accurately track the main IGT current but can also develop the undesirably large potential difference across the sense resistor during turn-off, which can cause avalanche breakdown of the IGT.

It is accordingly a primary object of the present invention to provide a novel IGT MOS-pilot structure which is not subject to the foregoing disadvantages.

It is another object of the present invention to provide a novel MOS-pilot for an IGT which is simple in construction and inexpensive to manufacture.

A further object of the present invention is to provide a MOS-pilot for a multiplicity of IGT cell interconnected in a lattice structure by modifying the lattice structure.

These and other objects of the invention, together with the features and advantages thereof, will become apparent from the following detailed specification when read with the accompanying drawings in which like reference numerals refer to like elements.

SUMMARY OF THE INVENTION

In accordance with the invention, a MOS-pilot structure for sensing total current flow through a multiplicity of IGT cells formed in a lattice network includes a plurality of pilot emitter electrodes, each in electrical contact with at least one pilot emitter region of a first plurality of the multiplicity of IGT cells. A metal contact strip electrically connects each of the plurality of emitter electrodes and the metal strip is connected to ground through a sense resistor.

Each of the first plurality and a second plurality of the multiplicity of IGT cells includes an anode region of a first conductivity type having one surface in contact with an anode electrode for connecting the device to an external circuit. A drift region of a second conductivity type overlies and contacts another surface of the anode region. A base region of the first conductivity type is formed in the drift region, with a plurality of emitter regions of the second conductivity type being formed in the base region. The emitter regions are spaced from the drift region by a base region boundary portion. An insulated gate electrode overlies all of the drift region, the base region boundary portion and a segment of each emitter region, to cause formation of a channel across the gate region boundary portion when a voltage is applied to the gate to permit channel current to flow between the drift region and the emitter regions.

A voltage is produced across the sense resistor by the channel current flowing from the at least one pilot emitter region of each of the first plurality of IGT cells to ground through the sense resistor. The resistor voltage can be compared to a reference voltage to cause the IGT cells to be turned-off when the resistor voltage exceeds the reference voltage level.

The MOS-pilot structure, as defined above, provides an indication of the total current flowing through the device by sensing only the magnitude of the channel current flowing in the at least one pilot emitter region of each of the first plurality of IGT cells. The combined channel currents, flowing in each of the at least one pilot emitter regions and in the MOS-pilot structure, defines a pilot current. Since the total number of the first plurality and the total number of a second plurality of the multiplicity of IGT cells are known, the ratio of pilot current to the total current flowing in the device is established; therefore, a large pilot current, corresponding to a proportionally large total current, produces a large voltage across the sense resistor to cause the IGT cells to be turned-off if the reference voltage level is exceeded.

A method for providing a MOS-pilot structure for a multiplicity of IGT cells formed in a lattice network, includes the steps of designating at least one emitter region of each of a first plurality of the multiplicity of IGT cells; depositing a plurality of pilot emitter electrodes in electrical contact with each of the at least one designated emitter regions; and fabricating a metal contact strip connected to the plurality of pilot emitter electrodes and electrically isolated from a cathode electrode of the multiplicity of IGT cells to facilitate electrical connection to the pilot structure. The metal contact strip can be electrically connected to ground through a sense resistor to provide a voltage across the sense resistor responsive to channel current flow.

BRIEF DESCRIPTION OF THE DRAWINGS

FIG. 8B is a cross-sectional view of the lattice network of FIG. 7B taken along line 8B—8B.

DETAILED DESCRIPTION OF THE PREFERRED EMBODIMENT

Figure 1:
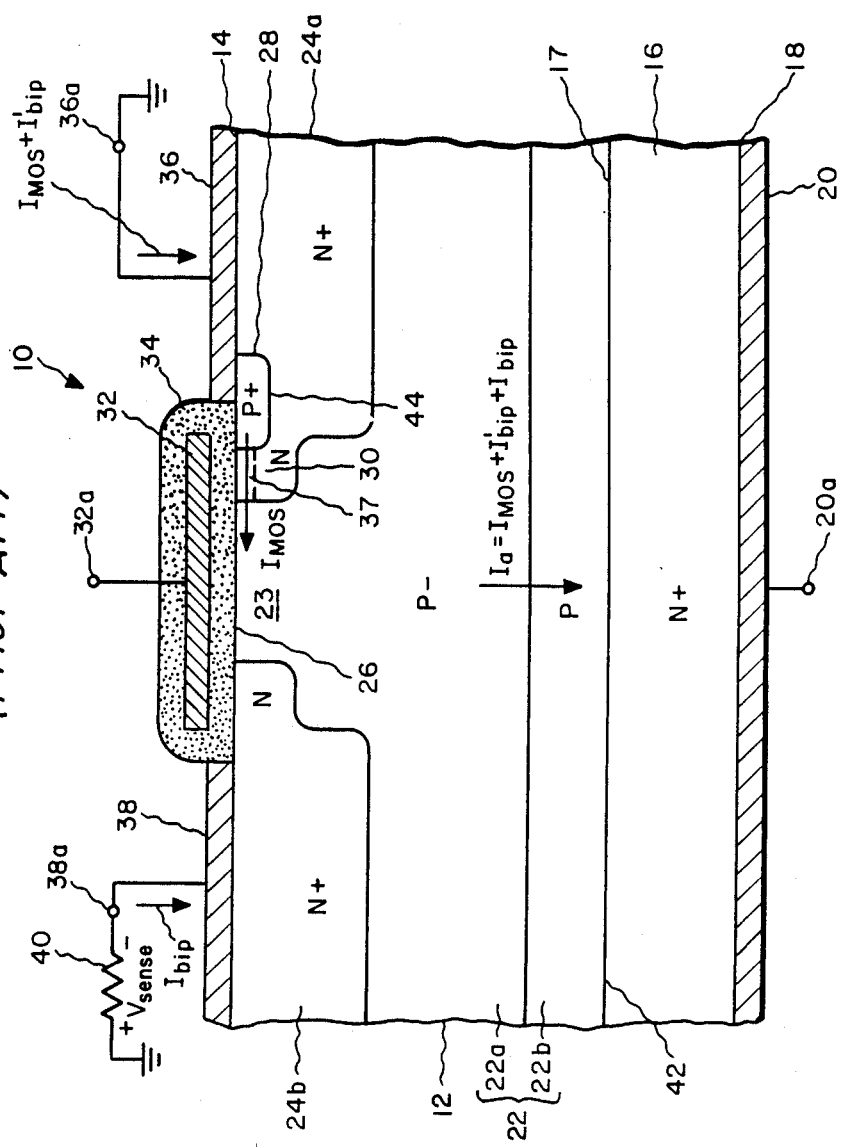
FIG. 1 is a cross-sectional view of a prior art MOS-pilot structure for sensing bipolar current.

Referring now to FIG. 1, a prior art device 10 has a MOS-pilot structure for sensing bipolar current $I_{bip}$, which is the current conducted by the bipolar transistor formed by the lower three semiconductor layers of an IGT. Device 10 includes a semiconductor substrate 12 having a principal substrate surface 14 and an anode region 16 of a first conductivity type semiconductor material (e.g. N type). Anode region 16 has a bottom surface 18 which is also the bottom surface for semiconductor substrate 12 opposite principal substrate surface 14. An anode electrode 20 is deposited on bottom surface 18 and an anode terminal 20a is provided for connecting the device to an exterior circuit. A drift region 22 of a second conductivity type semiconductor material (e.g. P type) abuts against another anode region surface 17 opposite bottom surface 18. Drift region 22 may have a lightly doped upper portion 22a and a more heavily doped lower portion 22b to provide a higher breakdown voltage and a lower forward voltage drop when device 10 is operational. An annular base region 24 of the first type conductivity is formed in drift region 22; an opening 26 is formed through the center of the base region 24 so that a portion 23 of drift region 22 extends to principal substrate surface 14 (in opening 26). An emitter region 28, of the second conductivity type, is formed in one base region portion 24a immediately below principal surface 14 and at sufficient spacing from the adjacent drift region portion 23 to provide a base region boundary portion 30 between emitter region 28 and drift region portion 23. A gate electrode 32 is disposed adjacent substrate surface 14 and is separated therefrom by a layer of insulative material 34. A gate terminal 32a is provided for connecting gate electrode 32 to an external circuit. Gate electrode 32 overlies all of drift region portion 23, boundary portion 30 and a segment of emitter region 28. The presence of a voltage on gate electrode 32, with respect to a first electrode 36 (contacting emitter region 28), causes a channel 37 (shown with broken line boundary) to be created across base region boundary portion 30 to permit channel current IMOS to flow between drift region 22 and emitter region 28, when the biasing voltage is of proper amplitude and polarity. The first electrode 36 is electrically connected to both emitter region 28 and to the adjacent base region portion 24a and is further connectable to an external ground potential through a terminal 36a. A second electrode 38 is connected to another base region portion 24b and is connectable to ground potential through a terminal 38a and through a sensing resistor 40.

Bipolar current $I_{bip}$ will flow from ground, through resistor 40 and via second electrode 38 through the device, to anode electrode 20; channel current $I_{MOS}$ and bipolar current $I'_{bip}$ will flow from ground, through the device via first electrode 36, to anode electrode 20, during operation of device 10. The total current $I_a$ flowing through device is then the summation of these currents as shown in FIG. 1, i.e., $I_a = I_{MOS} + I'_{bip} + I_{bip}$. Bipolar current $I_{bip}$ flowing through resistor 40 creates a sense voltage $V_{sense}$ across the resistor which provides an indication of the magnitude of the main current $I_a$ and therefore the total current flowing through the entire device 10. The sense voltage can be compared to a reference voltage and the device can be turned-off if the sensed voltage exceeds the reference voltage.

This method of predicting the total current flow through device 10 by sensing the bipolar current $I_{bip}$ may be inaccurate because the bipolar current may not linearly track the total device current $I_a$ due to gain fluctuations in the bipolar transistor formed by base region portion 24b, drift region 22 and anode region 16. These gain fluctuations may be attributed to debris deposited in the vicinity of a PN junction 42, formed between drift region 22 and anode region 16, at the edges of semiconductor substrate 12 during the fabrication of device 10. The gain of the bipolar transistor and the accuracy with which the bipolar current $I_{bip}$ will track the total current $I_a$ in the device may also be affected by the recombination activity of the electrons and holes in drift region 22. Additionally, during turn-off of the device a large potential difference can be created across resistor 40, due to the large potential difference between contact 38 and ground, relative to the ground potential at contact 36, to cause avalanche breakdown to occur across any reverse-biased PN junctions in the device.

Figure 2:
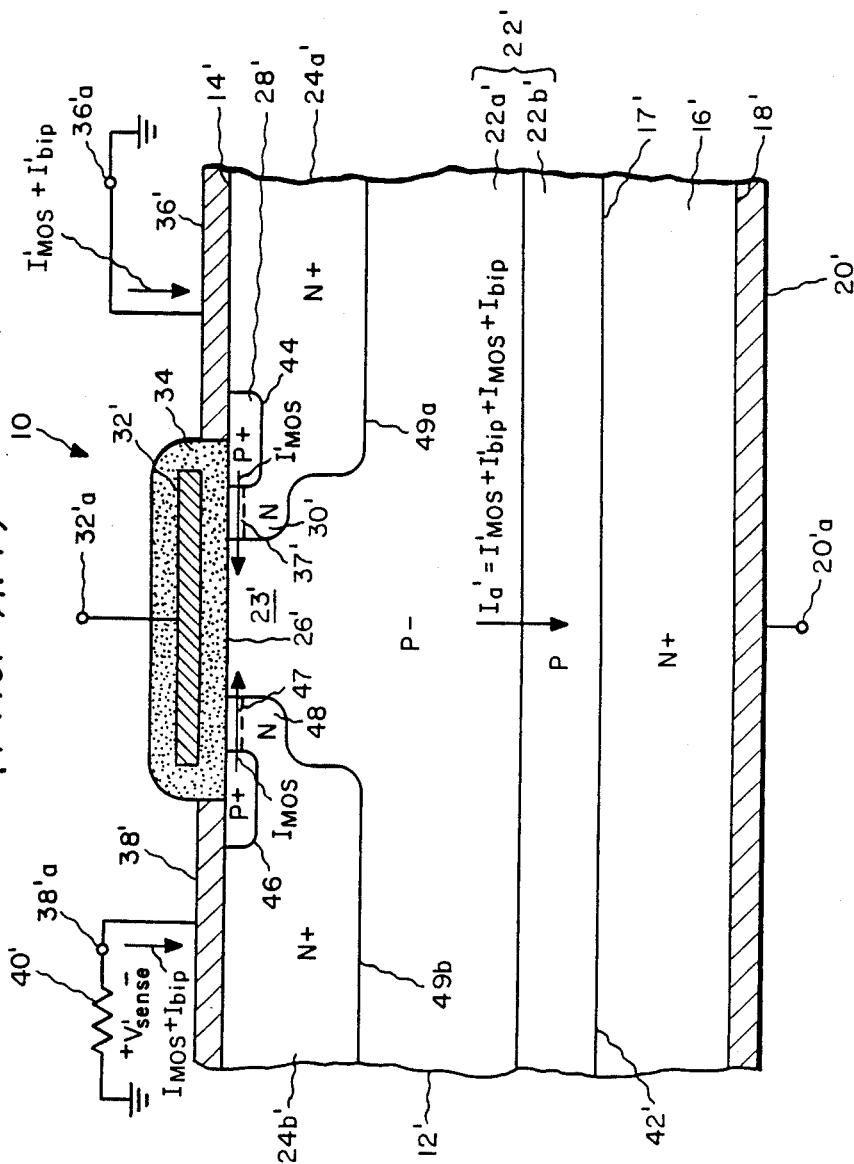
FIG. 2 is a cross-sectional view of a prior art MOS-pilot structure for sensing combined MOS channel and bipolar currents.

Referring now to FIG. 2, another prior art device 10' has a MOS-pilot structure that also allows sensing of the combined MOS channel current $I_{MOS}$ and bipolar current $I_{bip}$. This device 10' includes substantially all of the regions of the device 10 of FIG. 1 and also has at least one additional emitter region 46 formed in other base region portion 24b' (separate from emitter region 28'), and at a spacing from drift region portion 23' to provide another base region boundary portion 48 therebetween. Base region boundary portions 30' and 48, respectively may be more lightly doped than respective base regions 24a' and 24b', to increase the breakdown voltage along respective PN junctions 49a and 49b in the vicinity of base region boundary portions 30' and 48, respectively.

Gate electrode 32', disposed adjacent substrate surface 14' and separated therefrom by insulation layer 34', overlies all of drift region portion 23'; boundary portions 30' and 48 and a segment of each of emitter regions 28' and 46, to cause channels 37' and 47 (shown with broken line boundaries) to be created across base region boundary portions 30' and 48, respectively, to permit channel current $I'_{MOS}$ to flow between drift region portion 23' and emitter region 28' and to permit channel current $I_{MOS}$ to flow between drift region portion 23' and emitter region 46, when a biasing voltage of proper amplitude and polarity is applied to gate electrode 32' through terminal 32'a.

Second electrode 38' is electrically connected to both emitter region 46 and base region 24b' of the device, so that both MOS channel current $I_{MOS}$ and bipolar current $I_{bip}$ will flow through resistor 40' when device 10' is operational. Second electrode 38' is connected to resistor 40' by terminal 38'a. The voltage $V'_{sense}$ across resistor 40' caused by these combined currents may be compared to a reference voltage and if that reference voltage is exceeded, device 10' may be turned-off.

This prior art pilot structure, for sensing the combined MOS channel and bipolar currents to obtain an indication of the magnitude of the main current I'$_a$ passing through the IGT, has inherent inaccuracies for the same reasons as discussed with regard to the bipolar pilot of FIG. 1. Additionally, bipolar current may continue to flow through resistor 40' during device turn-off and a large potential difference can exist between second electrode 38' and ground, relative to the ground potential at first electrode 36'. This potential difference can be of sufficient magnitude to cause avalanche breakdown of those PN junctions within the device which are reverse-biased.

Figure 3:
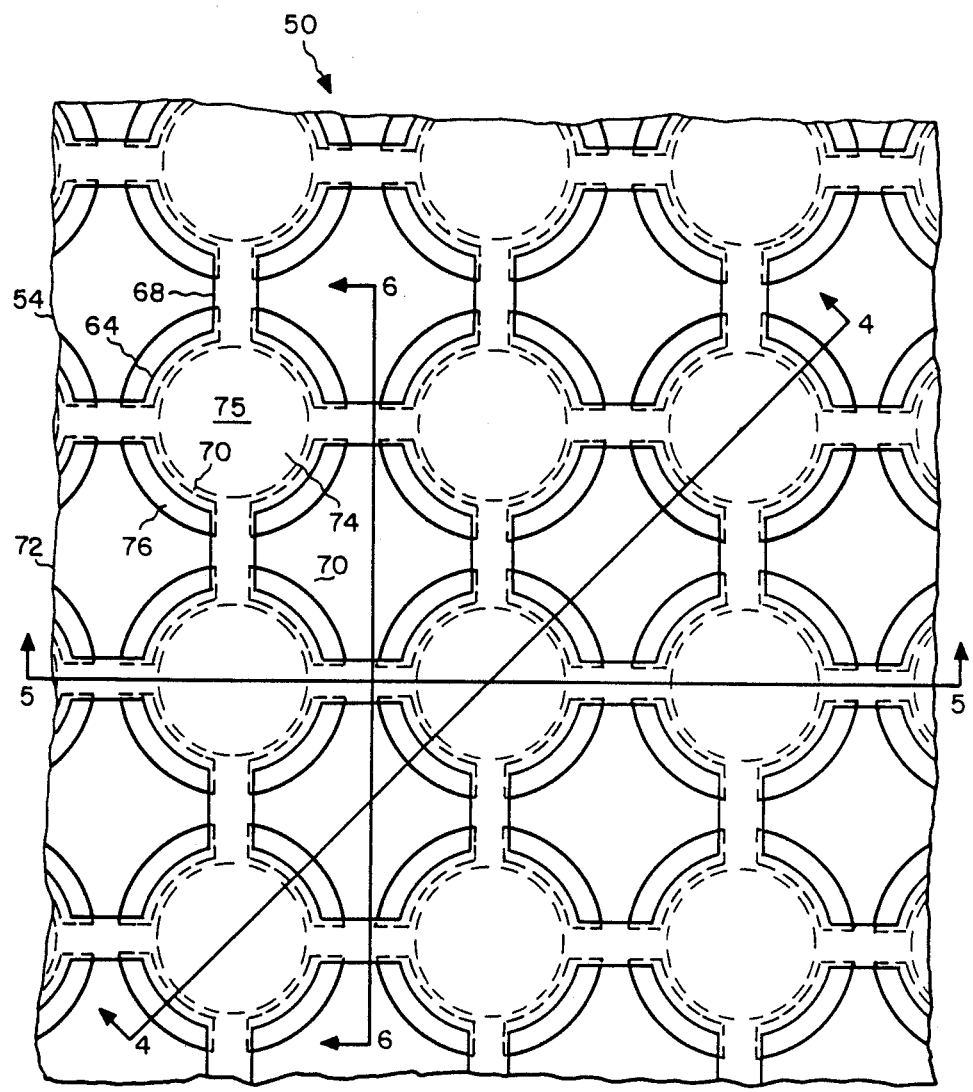
FIG. 3 is a plan view of a portion of a prior art lattice network of IGT cells.
Figure 4:
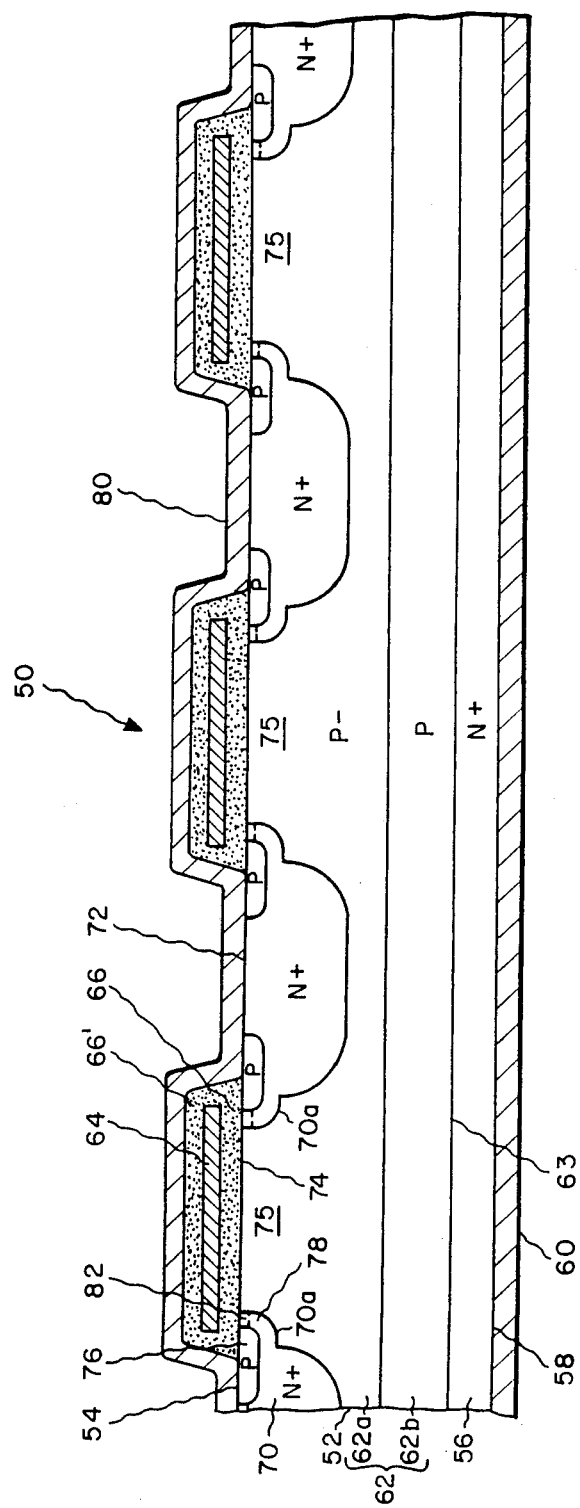
FIGS. 4, 5 and 6 are cross-sectional views through the prior art lattice network of FIG. 3 taken along lines 4—4, 5—5 and 6—6, respectively.
Figure 5:
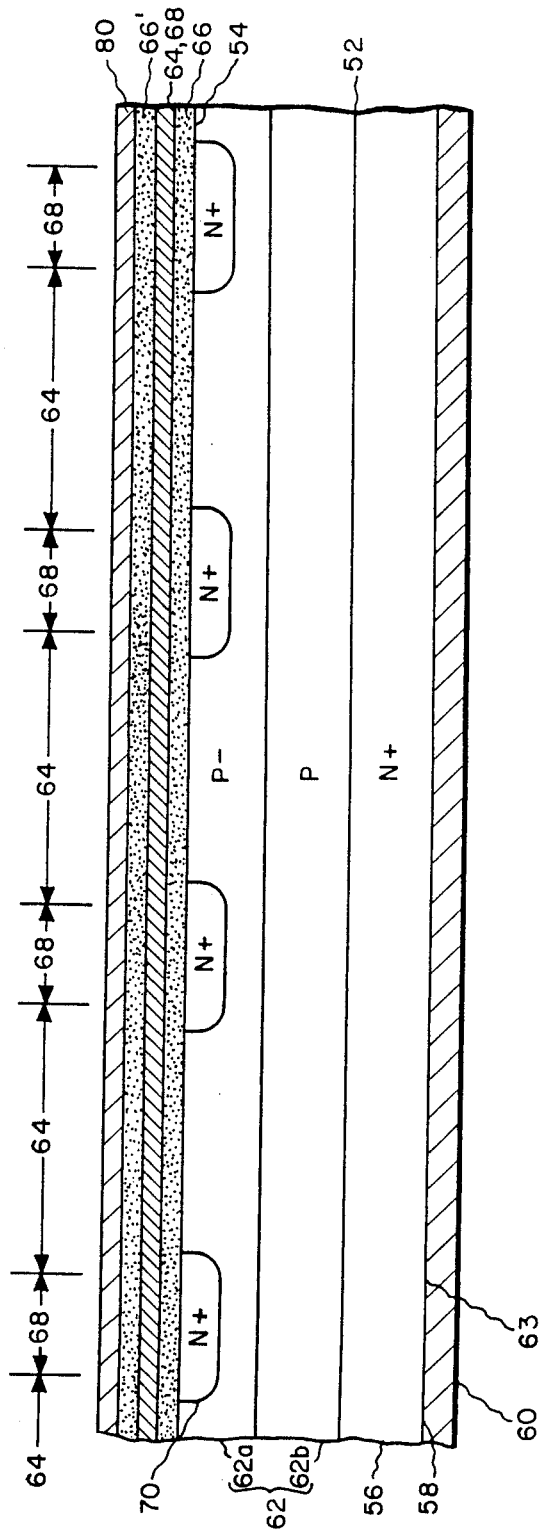
Figure 6:
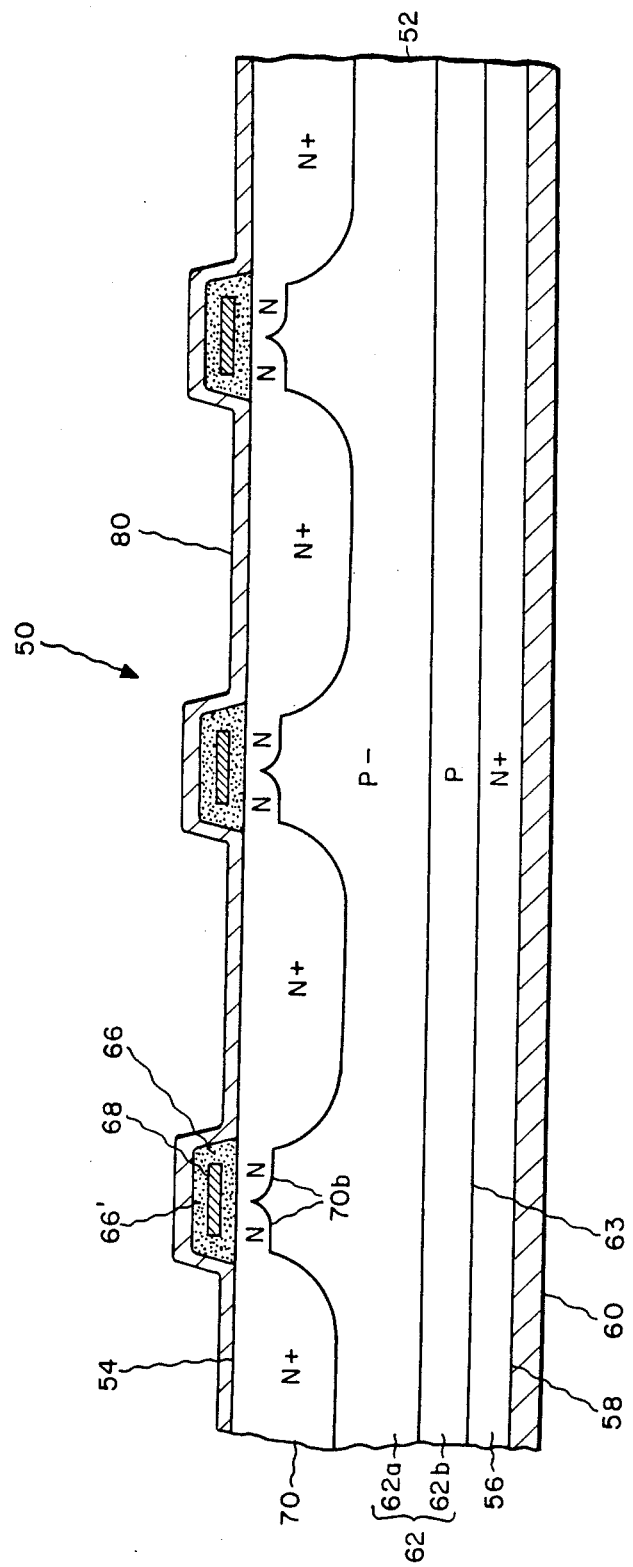

Another prior art device 50, shown in FIG. 3, includes a multiplicity of interconnected IGT cells formed in a lattice network. The IGT cells are generally interconnected by their gate electrodes 64, a common anode electrode (not shown in FIG. 3) and a common cathode electrode (not shown in FIG. 3) so that multiple cells may be utilized together to improve the voltage and current capacity of the overall device. While individual cells are shown to be substantially circular shaped, other geometric shape; could be utilized as well. FIGS. 4, 5 and 6 show cross-sections of the lattice network of FIG. 3 taken along lines 4—4, 5—5, and 6—6, respectively. Referring initially to FIGS. 3 and 4, the lattice structure is formed in a semiconductor substrate 52 having a principal substrate surface 54 Substrate 52 includes an anode region 56 of a first conductivity type (e.g. N+type) which terminates at a substrate bottom surface 58. An anode electrode 60 is in electrical contact with anode region 56 at bottom surface 58 and a drift region 62 of a second conductivity type e.g. P type) overlies and contacts anode region 56 at a surface 63 opposite bottom surface 58. Drift region 62 may have a lightly doped upper portion 62a and a more heavily doped lower portion 62b to provide a high breakdown voltage and a lower forward voltage drop when device 50 is operational. A plurality of gate electrodes 64 are disposed adjacent principal substrate surface 54 and spaced therefrom by a layer of insulation 66. Adjacent gate electrodes are interconnected by gate bridges 68 which are best shown in FIGS. 3 and 6. Gae bridges 68 are also spaced from substrate surface 54 by insulation layer 66. Insulation layer 66 is not shown in FIG. 3 for sake of clarity.

A base region 70 of the first conductivity type is diffused into drift region 62 through openings 72 formed in principal substrate surface 54 between gate electrode's 64 and gate bridges 68; base region 70 is laterally diffused under gate bridges 68 and partially under gate electrodes 64, as best shown in FIGS. 4 and 6 Base region portion 70a, partially diffused under gate electrodes 64 in FIG. 4, and base region portion 70b, laterally diffused under gate bridges 68 in FIG. 6, may both be more lightly doped relative to the remainder of base region 70 to improve the breakdown voltage of the PN junction between base region 70 and that portion of drift region 62 near principal substrate surface 54. Gate electrodes 64 act as a mask during diffusion of base region 70 and therefore a plurality of openings 74 are formed in base region 70 under gate electrodes 64; a drift region portion 75 extends through each of openings 74 to substrate surface 54. A plurality of emitter regions 76 of the second conductivity type are diffused into base region 70 through openings 72. Emitter regions 76 are also laterally diffused partially under gate electrodes 64 as shown in FIG. 4 and are each spaced from drift region portion 75 by a base region boundary portion 78.

A cathode electrode 80, for making electrical connections to the IGT cells of structure 50, is disposed on principal substrate surface 54 and in electrical contract with base region 70 and with emitter regions 76 at openings 72. Cathode electrode 80 may extend between adjacent openings 72 over gate electrodes 64 and gate bridges 68, and is maintained at a spacing therefrom by insulation layer 66'. Cathode electrode 80 is not shown in FIG. 3 for sake of clarity. A more detailed discussion of the lattice structure of FIGS. 3–6 is contained in Pat. No. 4,823,176, issued Apr. 18, 1989, which is incorporated herein in its entirety by reference.

The IGT cells become operational when a negative potential is applied to gate electrodes 64 and to anode electrode 60, with respect to the cathode electrode 30 potential. The negative voltage applied to gate electrodes 64 enhances a channel 82 (shown with broken line boundary in FIG. 4) across base region boundary portions 78 to permit channel current flow from emitter region 76 to drift region 62 and the negative voltage applied to anode electrode 60 causes current to flow to anode electrode 60 from cathode electrode 80 through the bipolar transistor formed by anode region 56, drift region 62 and base 70. This current is the bipolar current-$I_{bip}$ and is related to the MOS channel current-$I_{MOS}$ by the gain $\beta$ of the bipolar transistor i.e., $I_{bip}=\beta I_{MOS}$. The total current $I_T$ through the IGT is the sum of the MOS channel current $I_{MOS}$ and the bipolar current $I_{bip}$; therefore, $I_T=(1+\beta)I_{MOS}$.

Figure 7A:
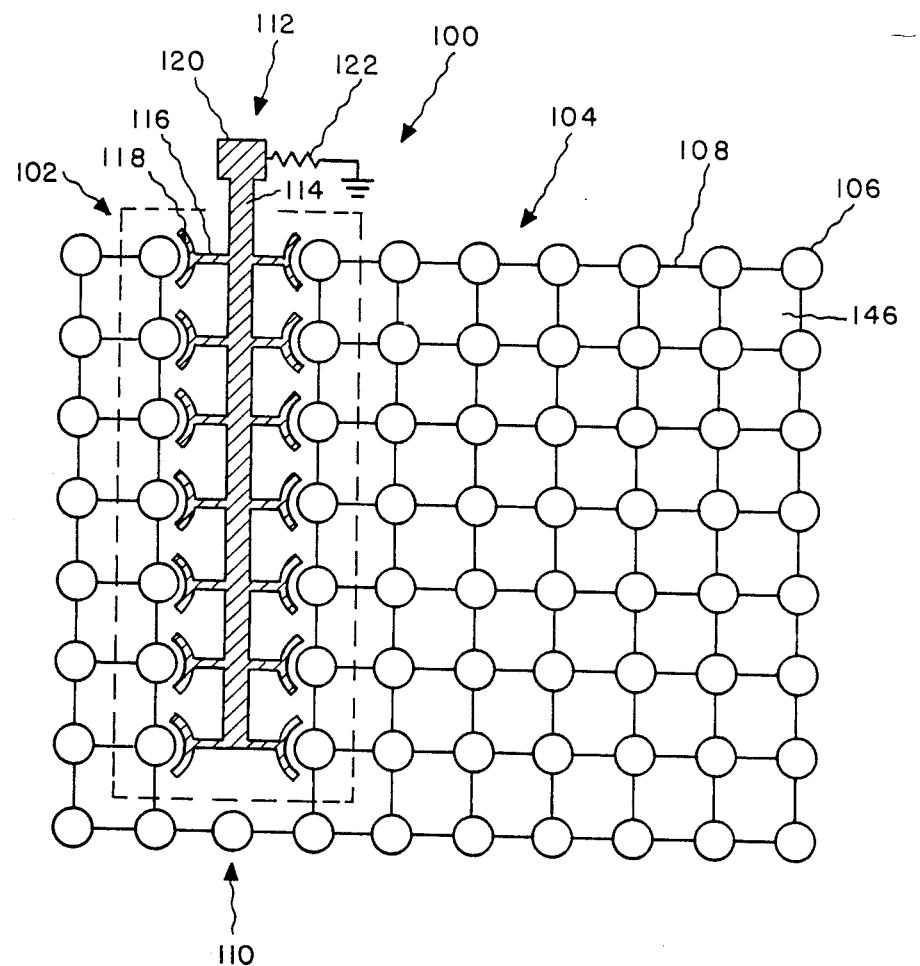
FIG. 7A is a schematic plan view of a lattice network of IGT cells with a MOS-pilot structure in accordance with the present invention.

In accordance with the present invention, as shown in FIG. 7A, a device 100 includes a MOS-pilot structure for a multiplicity of IGS cells formed in a lattice network, or cell array. The multiplicity of IGT cells includes a first plurality of IGT cells 102 (within the broken line boundary) and a second plurality of IGT cells 104 (outside the broken line boundary). For explanatory purposes, only the gate electrodes 106 and gate bridges 108 interconnecting adjacent gate electrodes are shown in the FIG. 7A. The pilot structure includes a portion of at least one column 110 (or row or diagonal) of the array of IGT cells formed without any gate electrodes, and which may be referred to as a gateless column (or gateless row). The first plurality of IGT cells 102 are then the IGT cells in the columns immediately adjacent to gateless column 110. The MOS-pilot structure 112 will be discussed in detail hereinbelow, but basically includes a strip of contact metal 114 deposited along the principal substrate surface (not shown) of gateless column 110 and used with a plurality of contact metal bridge as 116 to electrically connect each of a plurality of emitter electrodes 118, each in electrical contact with at least one emitter region (not shown) of each of the first plurality of IGT cells 102, to a pad 120, of contact metal. Connect metal strip 114, metal bridges 116 and pad 120 are electrically isolated from the principal substrate surface. Pad 120 may be integrally formed with contact metal strip 114 on the principal substrate surface proximate to one edge of the substrate, to facilitate electrical connection of contact metal strip 114, to some other element, e.g. to ground potential through a sense resistor 122. Sense resistor 122 may be either an externally connected resistor or integrally formed with device 100 during the fabrication process, in a manner well known in the art, to form a completely packaged device.

Contact metal strip 114, contact metal bridges 116 and emitter electrodes 118 may be formed from an alloy of aluminum and 0.5% by weight of copper. Other contact metal compositions may be used as well, provided that the compositions utilized exhibit a good ohmic connection to the emitter regions of first plurality 102 and do not present electro-migration problems when the device is annealed or sintered.

Figure 7B:
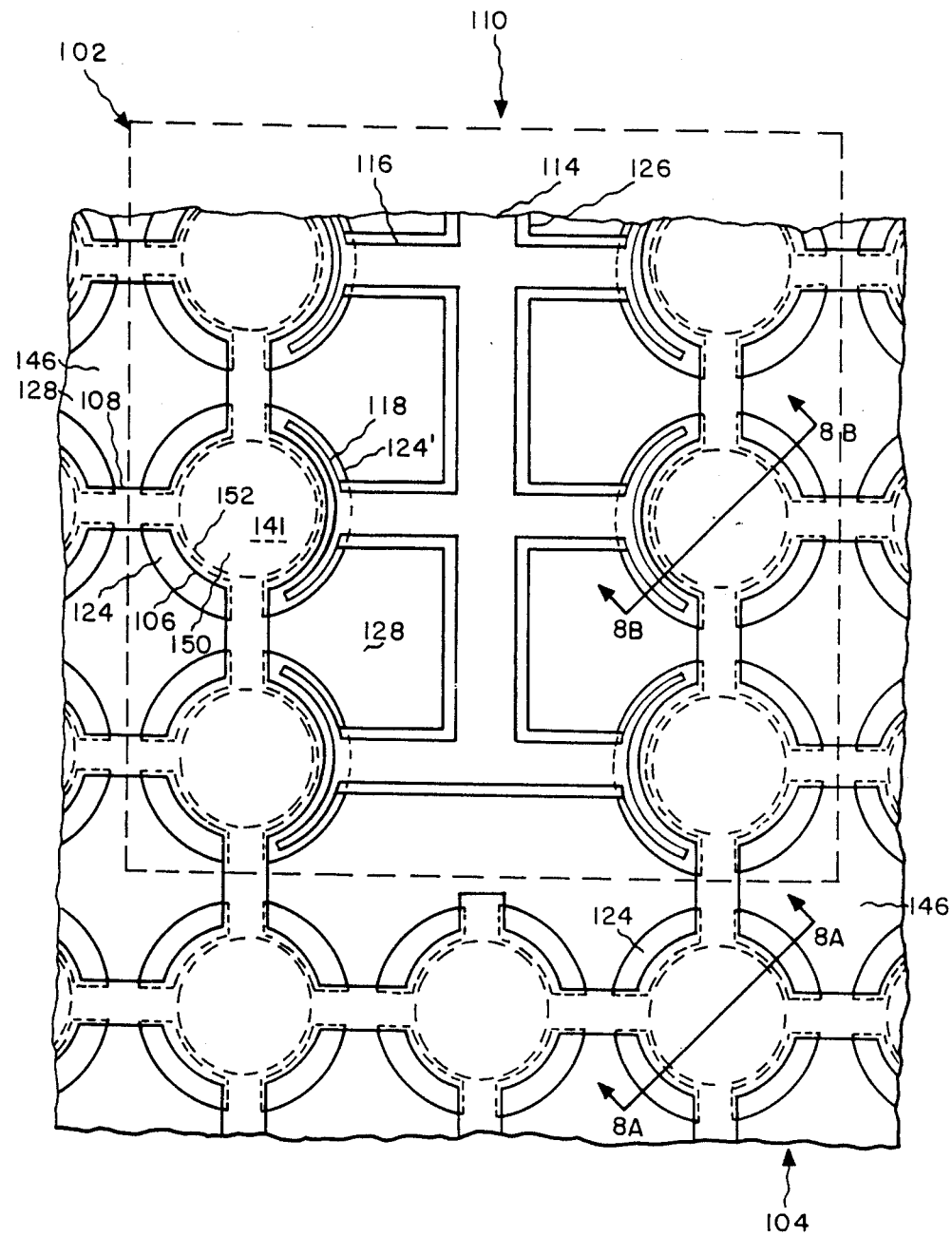
FIG. 7B is a detailed plan view of a portion of the lattice network of FIG. 7A.

FIG. 7B is a plan view of a portion of the lattice network of FIG. 7A showing in detail a portion of the gateless column 110' and the interconnection of contact metal strip 114, contact metal bridges 116 and emitter electrodes 118 to at least one emitter region 124' of each IGT cell of first plurality 102. Emitter electrodes 118 may also be called pilot emitter electrodes and the at least one emitter regions 124' may be referred to as pilot emitter regions. Contact metal strip 114 and contact metal bridges 112 are deposited on the principal substrate surface and spaced therefrom by a layer of insulation 126. Windows are formed in insulation layer 126 over pilot emitter regions 114' of first plurality 102 to permit pilot emitter electrodes 118 to be deposited in electrical contact with only pilot emitter regions 124'. Pilot emitter electrodes 118 and the remaining MOS-pilot structure metallization must not contact base region 128 into which pilot emitter regions 124' are diffused. Pilot emitter electrodes 118 are substantially accurately shaped to correspond to the arcuate shape of pilot emitter regions 124' which are diffused around circularly shaped gate electrodes 106 into base region 128. While the gate electrodes and IGT cells are represented in FIG. 7B as being substantially circular in shape, other geometric configurations may also be used.

Figure 8A:
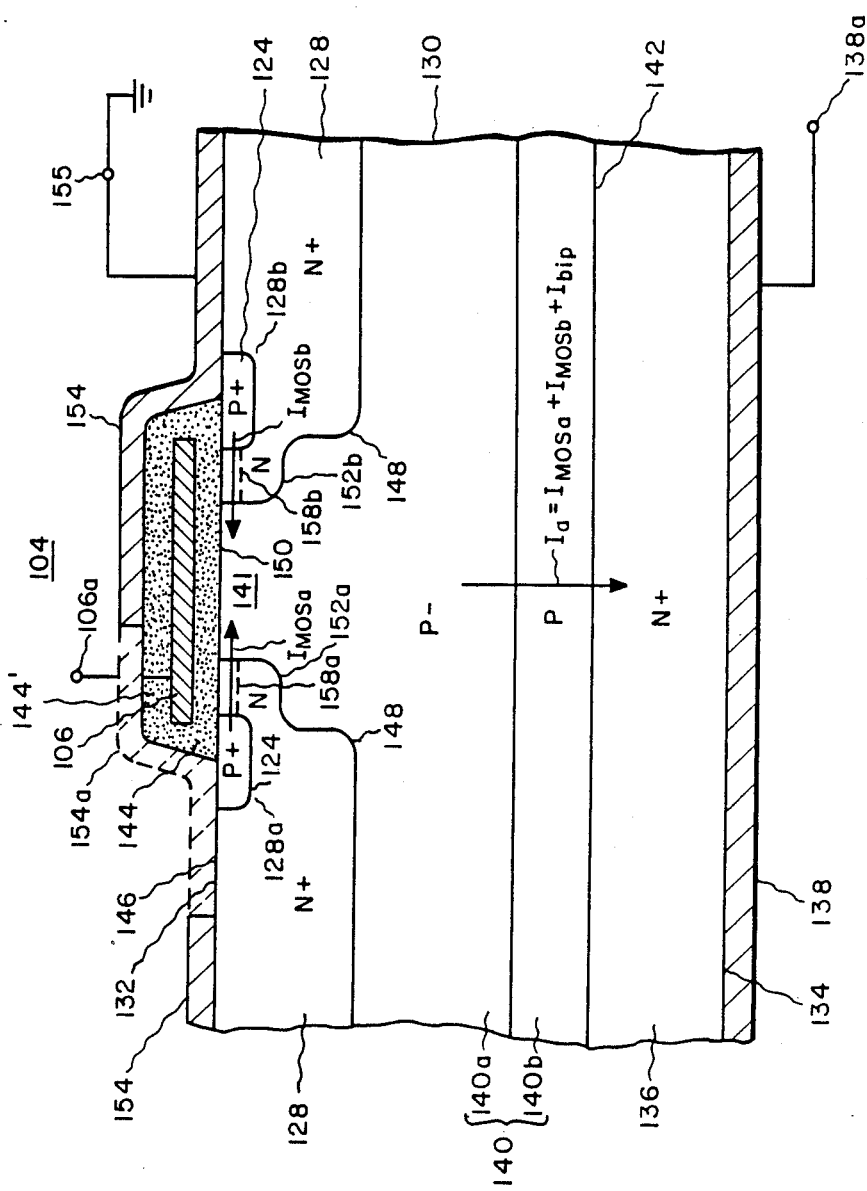
FIG. 8A is a cross-sectional view of the lattice network of FIG. 7B taken along line 8A—8A.

First plurality of cells 102 and second plurality of cells 104 of the multiplicity of IGT cells are preferably formed at the same time during the fabrication process and have similar structures; therefore, the two structures will be described simultaneously and the differences will be pointed out with reference to FIGS. 8A and 8B. The structure of the second plurality of cells 104 can be similar to that of the prior art device of FIGS. 3–6. FIG. 8A shows one IGT cell 104 of the second plurality, in a cross-sectional view taken along line 8A—8A in FIG. 7B and FIG. 8B shows one IGT cell 102 of the first plurality, in a cross-sectional view taken along line 8B—8B in FIG. 7B. The first plurality of IGT cells and the second plurality of IGT cells are formed in a common semiconductor substrate 130 which has a principal substrate surface 132 and a bottom substrate surface 134. An anode region 136 of a first conductivity type semiconductor material (e.g. N+) is formed in substrate 130 and terminates at bottom surface 134. An anode electrode 138 is in electrical contact with anode region 136 at bottom surface 134 and a drift region 140 of a second conductivity type semiconductor material (e.g. P) overlies and contacts anode region 136 at a surface 142 opposite bottom surface 134. A first terminal 138a is provided for connecting anode electrode 138 to an external circuit. Drift region 140 may have a lightly doped upper portion 140a and a more heavily doped lower portion 140b to provide a high breakdown voltage and a lower forward voltage drop when the array of IGT cells are operational. As previously discussed with respect to FIG. 7A, a plurality of gate electrodes 106 are disposed adjacent principal substrate surface 132 and spaced therefrom by a layer of insulation 144. The gate electrodes 106 and interconnecting gate bridges 108 form a mask having a plurality of openings or windows 146 as best shown in FIGS. 7A and 7B. Case region 128 of the first conductivity type semiconductor material is diffused into drift region 140 through windows 146 formed between gate electrodes 106 and gate bridges 108; base region 128 is laterally diffused under gate bridges 108 (not shown) and laterally diffused, partially under gate electrodes 106 as shown in FIG. 8A. Base region 128 may be a single region or a plurality of separate base regions if base region 128 is not laterally diffused under gate bridges 108 to join adjacent regions. Base region portions 152a, 152b, 152c and 152d which are partially diffused under gate electrode 106 may be more lightly doped, relative to the remainder of base region 128, to improve the breakdown voltage along PN junction 148 near principal substrate surface 132. A plurality of openings 150 are formed in base region 128, under gate electrodes 106 (during the diffusion of base region 128) as a result of the masking effect; of gate electrodes 106 each drift region 140 has a portion 141 extending through one of openings 150 to substrate surface 132. A plurality of emitter regions 124 and pilot emitter regions 124' (in first plurality cells 102) of the second conductivity type semiconductor material are diffused into base region portions 128a, 128b, 128c and 128d, respectively, through windows 146, and are positioned in a substantially arcuate arrangement around each gate electrode. 106, as best shown in FIG. 7B. Base region portions 121a, 128b, 128c and 128d may be portions of a single base region or may each be a portion of a separate base region of a plurality of base regions if base region 128 is not laterally diffused under gate bridges 108 to join adjacent separate base regions into a single region as described hereinabove. As best seen in FIGS. 8A and 8B, each emitter region 124 and pilot emitter region 124' is laterally diffused, to partially extend under gate electrode 106, and is spaced from drift region portion 141 by intervening base region boundary portions 152a, 152b, 152c and 152d, respectively.

Pilot emitter regions 124' of first plurality of IGT cells 102, which are to form MOS-pilot structure 112, may be increased in size along principal substrate surface 132, as shown in FIG. 8B', by diffusing additional P+ material through opening 146 and into base portion 128d or by providing a bigger window 146 in the mask when the plurality of emitter regions 124 and pilot emitter regions 124' are originally diffused into base region 128. The increased area of pilot emitter region 124' exposed at principal substrate surface 132 will facilitate the depositor of pilot emitter electrode 118 and improve the ohmic contact between pilot emitter region 124' and pilot emitter electrode 118 when emitter electrode 118 is deposited in contact with emitter region 124' as shown in FIG. 8B.

Referring to FIGS. 8A and 8B, a cathode electrode 150 (not shown in FIGS. 7A and 7B) is disposed on principal substrate surface 132 and electrically contacts both base region or regions 128 and emitter regions 124 of second plurality cells 104, through openings 146. Cathode electrode 154 is also disposed on principal substrate surface 132 in electrical contact with base region 128 and with emitter regions 124 of the first plurality 102 of IGT cells but is not in contact with pilot emitter regions 124'. Cathode electrode 154 may extend between adjacent openings 146, over gate electrodes 106 and gate bridges 108, and is maintained at a spacing from gate electrodes 106 and gate bridges 108 by insulation layer 144'. A portion 154a of the cathode electrode 154 (shown in phantom in FIG. 8A) would not be deposited on (or would be removed from) substrate surface 132 at opening 146 if a first plurality IGT cell 102 is to be formed so that pilot emitter electrode 118 may be formed separately from cathode electrode 154. Cathode electrode 154 is connected to a second device terminal 155 for electrically connecting cathode electrode 154 to an external circuit.

Referring now to FIG. 8B, in accordance with the present invention, pilot emitter electrode 118 is deposited on substrate surface 132 in electrical contact with only pilot emitter region 124′. As previously described with respect to FIGS. 7A and 7B, emitter electrode 118 is connected to ground potential through an electrical path which includes contact metal bridge 116, contact metal strip 114, pad 120, a third device terminal 120a and sense resistor 122 (shown in phantom in FIG. 8B). The MOS-pilot structure metallization (which includes emitter electrodes 118, contact metal bridges 116 and contact metal strip 114) may be formed during the same process step as cathode electrode 154 to form a single metallization pattern. or may be formed in another process step and may be deposited over portions of cathode electrode 154, as required, to define a dual level metallization pattern. In any event, the MOS-pilot structure metallization of pilot emitter electrodes 118 and pilot emitter regions 124′ are connected together, but both must be electrically isolated from cathode electrode 154, as by a layer 156 of insulation (FIG. 8B). Cathode electrode 154 is electrically connected to ground as shown in FIG. 8B through terminal 155 to maintain base region 128 and emitter region 114 at ground potential.

Referring back to FIG. 8A, in operation, channels 158a and 158b will be increasingly enhanced across base region boundary portions 152a and 152b, respectively when an increasingly negative voltage is applied to gate electrode 106, with respect to cathode electrode 154 through gate terminal 106a. MOS channel currents $I_{MOSa}$ and $I_{MOSb}$ will then flow through channels 158a and 158b, from emitter regions 124, to drift region portion 141. Similarly, referring to FIG. 8B, channels 159a and 159b will be increasingly enhanced across base region boundary portions 152d and 152c, respectively, and MOS channel current $I'_{MOS}$ and $I_{MOSc}$ will respectively flow through channels 159a and 159b when the increasingly negative voltage is applied to gate electrode 106, with respect to cathode electrode 154. MOS channel current $I'_{MOS}$ will further flow to pilot emitter region 124′ from ground through an electrical path comprising pilot emitter electrode 118, contact metal bridges 116, contact metal strip 114, third terminal 120a and sense resistor 122. The magnitude of the voltage across the resistor 122 will be a function of the resistance of resistor 122 and the pilot current $I_p$, which is the combined channel currents $I'_{MOS}$ flowing to those pilot emitter regions 124′ selected to be interconnected to contact metal strip 114. The voltage created across resistor 122, by pilot current $I_p$, may be used as required, e.g., may be compared to a reference voltage and, if the reference voltage is exceeded, device 100 may be turned-off to protect the device from damage. Since the voltage across resistor 122 is a function of only the MOS channel current $I'_{MOS}$ and the resistance of resistor 122, and not the bipolar current $I_{bip}$ (conducted by the bipolar transistor formed by the combination of base region 128, drift region 140 and anode region 136), the MOS-pilot structure of device 100 is not subject to the inaccuracies and avalanche breakdown problems associated with the prior art MOS-pilots previously discussed.

It will be readily understood by those skilled in the art that the present invention is not limited to the specific embodiments described and illustrated herein. Different embodiments and adaptations besides those shown here n and described, as well as many variations, modifications and equivalent arrangements will now be apparent or will be reasonably suggested by the foregoing specification and drawings, without departing from the substance or scope of the invention. While the present invention was described with each semiconductor region having a particular type of conductivity, opposite conductivities could be used is well with corresponding opposite polarities of voltage and opposite directions of current flow. Accordingly, it is intended that the invention be limited only by the spirit and scope of the claims appended hereto.

What is claimed is:

1. A semiconductor device, comprising:
   an anode region of a first conductivity type semiconductor material;
   anode means for electrically connecting said anode region to a first terminal of said device;
   a drift region, of a second conductivity type semiconductor material, having a first surface contacting said anode region and a second surface opposite to said first surface;
   a base region, of said first conductivity type semiconductor material, formed in said drift region second surface and having separated first and second boundary portions each adjacent to both aid drift region and said second surface;
   at least one emitter region of said second conductivity type semiconductor material, formed in a first portion of said base region adjacent to said first base region boundary portion and on an opposite side thereof from said drift region;
   cathode means for electrically connecting all of said at lest one emitter region and said base region to a second terminal of said device;
   a gate electrode insulativiely overlying both of said base region boundary portions and an adjacent portion of said drift region, and operative to cause a channel current to flow through said first base region boundary portion and between said anode and cathode means, responsive to application of a bias potential between said cathode means and a gate terminal of said device, connected to said gate electrode;
   at least one pilot emitter region, of said second conductivity type semiconductor material, formed in a second portion of said base region, different from said base region first portion, adjacent to said second boundary portion of said base region and on an opposite side thereof from said drift region; and
   pilot means for connecting said at least one pilot emitter region to a third terminal of said device to provide a pilot current flowing through said third terminal and having a magnitude substantially equal to a fixed proportion of the channel current then flowing.

2. The device of claim 1 wherein said pilot means further includes means for producing a sense voltage responsive to the pilot current flowing though said third terminal.

3. The device of claim 1, wherein said pilot means is electrically connected only to said at least one pilot emitter region.

4. The device of claim 1 wherein said pilot means comprises a pilot emitter electrode to electrically connect said at least one pilot emitter region to a sense resistor to produce a sense voltage across said resistor, responsive to said pilot current flowing through said resistor.

5. A semiconductor device formed of a multiplicity of cells interconnected in a lattice structure, comprising:
   a common anode region of a first conductivity type semiconductor material;
   common anode means for electrically connecting said anode region to a first terminal of said device;
   a common drift region, of a second conductivity type semiconductor material, having a first surface contacting said anode region ad a second surface opposite to said first surface;
   a common base region, of said first conductivity type semiconductor material, formed in said drift region second surface and having a multiplicity of openings therein, with each opening occupied by an intermediate portion of said drift region and with each opening bounded by a base region boundary portion and defining one of said multiplicity of cells;
   a first plurality of said multiplicity of cells, each including:
   (a) one of said drift region intermediate portions,
   (b) at least one emitter region, of said second conductivity type semiconductor material, formed in a first portion of said base region spaced from said one drift region intermediate portion by a first section of an associated one of said base region boundary portions,
   (c) cathode means of electrically connecting said at least one emitter region and the adjacent base region of each of said first plurality of cells to a second terminal of said device,
   (d) a gate electrode insulativiely overlying both of at least a part of the associated base region boundary portion and said one intermediate drift region portion of each of said first plurality of cells, and operative to cause a channel current to flow through said first section of said associated base region boundary portion and between said common anode and cathode means, responsive to application of a bias potential between said cathode means and a gate terminal of said device, connected to said gate electrode, and
   (e) at least one pilot emitter region, of second conductivity type semiconductor material, formed in a second portion of said base region, different from said base region first portion, and spaced from said one of said drift region intermediate portion by a second section of said associated base region boundary portion interposed therebetween; and
   pilot means for connecting said at least one pilot emitter region of each of a selected number of said first plurality of cells to a third terminal of said device, to provide a pilot current flowing through said third terminal and having a magnitude substantially equal to a fixed proportion of the channel currents then flowing in said first plurality of cells.

6. The device of claim 5, wherein said pilot means further includes means for producing a sense voltage responsive to the pilot current flowing through said third terminal.

7. The device of claim 5, wherein said pilot means is electrically connected only to said at least one pilot emitter region of each of said first plurality of cells.

8. The device of claim 5, wherein said pilot means comprises a pilot emitter electrode to electrically connect said at least one pilot emitter region of each selected one of the first plurality of cells to a sense resistor to produce a sense voltage across said resistor, responsive to said pilot current flowing through said resistor.

9. The device of claim 5, further comprising a second plurality of said multiplicity of cells, different from said first plurality, each including:
   one of said drift region intermediate portions;
   at least one emitter region, of said second conductivity type semiconductor material, formed in said base region and spaced from said one drift region intermediate portion by an associated one of said base region boundary portions;
   said cathode means also electrically connecting all of said at least one emitter region and the adjacent base region of each of said second plurality of cells to said second terminal; and
   a gate electrode, insulativiely overlying both of at least a part of said one intermediate drift region portion and the associated base region boundary portion of each of said second plurality of cells, connected to said gate terminal and operative to cause another channel current to flow through said associated base region boundary portion, responsive to application of said bias potential between said gate terminal and said cathode means; and
   said pilot means providing said pilot current with a magnitude substantially equal to a fixed proportion of the sum of all channel currents then flow in said first and second plurality of cells.

10. A semiconductor device, comprising:
    an anode region of a heavily doped first conductivity type semiconductor material;
    anode means for electrically connecting said anode region to a first terminal of said device;
    a drift region, of a second conductivity type semiconductor material, having a first surface contacting said anode region and a second surface opposite to said first surface;
    at least first and second base regions, of aid first conductivity type semiconductor material, formed in said drift region second surface and having respective first and second boundary portions each adjacent to both said drift region and said second surface;
    at least one emitter region, of said second conductivity type semiconductor material, formed in said first base regions adjacent to said first base region boundary portion and on an opposite side thereof from said drift region;
    cathode means for electrically connecting said at least one emitter region and said first base region to a second terminal of said device;
    at least one bipolar transistor formed by a combination of: said first base region, said drift region, and said heavily doped anode region, to provide a bipolar current flowing between said cathode means and said anode means when said device is operational;
    a gate electrode insulativiely overlying both of said base region boundary portions and an adjacent portion of said drift region, and operative to cause a channel current to flow through said first base region boundary portion and between said anode and cathode means, responsive to application of a bias potential between said cathode means and a gate terminal of said device, connected to said gate electrode;

at least one pilot emitter region, of said second conductivity type semiconductor material, formed in said second base region, adjacent to said second base region boundary portion and on an opposite side thereof from said drift region; and pilot means for connecting said at least one pilot emitter region to a third terminal of said device to provide a pilot current flowing through said third terminal and having a magnitude substantially equal to a fixed proportion of the channel current, and independent of the bipolar current, then flowing.

11. The device of claim 10, wherein said pilot means further includes means for producing a sense voltage responsive to the pilot current flowing through said third terminal.

12. The device of claim 10, wherein said pilot means is electrically connected only to said at least one pilot emitter region.

13. The device of claim 10, wherein said pilot means comprises a pilot emitter electrode to electrically connect said at least one pilot emitter region to a sense resistor to produce a sense voltage across said resistor, responsive to said pilot current flowing through said resistor.

14. A semiconductor device formed of a multiplicity of cells interconnected in a lattice structure, comprising:
a common anode region of a first conductivity type semiconductor material;
common anode means for electrically connecting said anode region to a first terminal of said device;
a common drift region, of a second conducting semiconductor material, having a first surface contacting said anode region and a second surface opposite to said first surface;
a plurality of base regions, of said first conductivity type semiconductor material, formed in said drift region second surface and having a multiplicity of openings therebetween, with each opening occupied by an intermediate portion of said drift region and with each drift region intermediate portion bounded by a plurality of associated base region boundary portions and defining one of said multiplicity of cells;
a first plurality of said multiplicity of cells, each including:
(a) one of said drift region intermediate portions,
(b) at least one emitter region, of said second conductivity type semiconductor material, formed in one base region of said plurality of base regions and spaced from said one drift region intermediate portion by one of said plurality of associated base region boundary portions,
(c) cathode means for electrically connecting said at least one emitter region and said one base region of each of said first plurality of cells to a second terminal of said device,
(d) a gate electrode, insulativiely overlying both of at least a part of the one intermediate drift region portion and the plurality of associated base region boundary portions of each of said first plurality of cells, and operative to cause a channel current flow through said associated base region boundary portions and between said common anode and cathode beams responsive to application of a bias potential between said cathode means and a gate therminal of said device. connected to said gate electrode. and
(e) at least one pilot emitter region, of said second conductivity type semiconductor material, formed in another one of said plurality of base regions, and spaced from the one drift region intermediate portion by another one of said plurality of associated base region boundary portions interposed therebetween; and pilot means for connecting said at least one pilot emitter region of each of a selected number of said first plurality of cells to a third terminal of said device, to provide a pilot current flowing through said third terminal and having a magnitude substantially equal to a fixed proportion of the channel currents then flowing in said first plurality of cells.

15. The device of claim 14, wherein said pilot means further includes means for producing a sense voltage responsive to the pilot current flowing through said third terminal.

16. The device of claim 14, wherein said pilot means is electrically connected only to said at least one pilot emitter region of each of said first plurality of cells.

17. The device of claim 14, wherein said pilot means comprises a pilot emitter electrode to electrically connect said at least one pilot emitter region of each selected one of the first plurality of cells to a sense resistor to produce a sense voltage across said resistor, responsive to said pilot current flowing through said resistor.

18. The device of claim 14, further comprising a second plurality of said multiplicity of cells, different from said first plurality, each including:
one of said drift region intermediate portions;
at least one emitter region, of said second conductivity type semiconductor material, formed in a further one of said plurality of base regions and spaced from said one drift region intermediate portion by an associated one of said plurality of base region boundary portions;
said cathode means also electrically connecting said at least one emitter region and said further one base region of each of said second plurality of cells to said second terminal; and
a gate electrode, insulativiely overlying both of at least a part of the one intermediate drift region portion and the plurality of associated base region boundary portions of each of said second plurality of cells, connected to said gate terminal and operative to cause another channel current to flow through said plurality of associated base region boundary portions, responsive to application of said bias potential between said gate terminal and said cathode means; and
said pilot means providing said pilot current with a magnitude substantially equal to a fixed proportion of the sum of all channel currents then flowing in said first and second plurality of cells.

* * * * *